United States Patent [19]

Weiss

[11] Patent Number: 5,001,484
[45] Date of Patent: Mar. 19, 1991

[54] DAC CURRENT SOURCE BIAS EQUALIZATION TOPOLOGY

[75] Inventor: Frederick G. Weiss, Newberg, Oreg.

[73] Assignee: TriQuint Semiconductor, Inc., Beaverton, Oreg.

[21] Appl. No.: 521,069

[22] Filed: May 8, 1990

[51] Int. Cl.$^5$ .................... H03M 1/80; H03M 1/78
[52] U.S. Cl. .................................. 341/153; 341/154; 341/133
[58] Field of Search ............. 341/153, 154, 133, 144

[56] References Cited

U.S. PATENT DOCUMENTS

| | | | |
|---|---|---|---|
| 3,077,303 | 2/1963 | Palevsky et al. | 341/153 |
| 3,223,994 | 12/1965 | Cates | 341/153 |
| 3,585,633 | 6/1971 | Young | 341/153 |
| 3,815,121 | 6/1974 | Wilensky | 341/153 |
| 3,978,473 | 8/1976 | Pastoriza | 341/153 X |
| 4,020,486 | 4/1977 | Pastoriza | 341/153 X |
| 4,141,004 | 2/1979 | Craven | 341/153 |
| 4,336,528 | 6/1982 | Kane | 341/153 X |
| 4,603,319 | 7/1986 | Hinn | 341/153 X |

Primary Examiner—William M. Shoop, Jr.
Assistant Examiner—Sharon D. Logan
Attorney, Agent, or Firm—Alan K. Aldous

[57] ABSTRACT

A DAC includes a simple width-scaled weighted array (104) of N number of current sources and a weighted cascode current divider (108) comprised of m number of current sources. The simple width-scaled weighted array conducts N first scaled currents ($I_0$-$I_3$), the array including N first transistors (116a-116d) connected to different ones of N second transistors (112a-112d), one of the N second transistors (112d) having a gate width w. The weighted cascode current divider includes M current sources, the current divider including M third transistors (120a-120d) that conduct M second scaled currents ($I_4$-$I_7$) which are summed at a node (134). The node is connected to a master current transistor (138) that conducts a current $I_S$ and has a gate width w. In one embodiment, the bias of the N first transistors is tied to the node, whereby relative magnitudes of the N first scaled currents remain in correct proportion to relative magnitudes of the M second scaled currents in spite of changes in the magnitude of current $I_S$. In another embodiment, the first and second inputs to an operational amplifier are connected to the node and the drain of the transistor of the second N transistors having a gate width w, respectively. The output to the operational amplifier is connected to the bias of the N first transistors. The DAC could have twelve bits with, for example, N=6 and M=6.

12 Claims, 5 Drawing Sheets

DAC CURRENT SOURCE BIAS EQUALIZATION TOPOLOGY

FIELD OF THE INVENTION

The present invention relates to a digital-to-analog converter ("DAC") and, in particular, to a gallium arsenide high resolution DAC that employs a simple width-scaled binary-weighted current source array in parallel with a binary-weighted cascode current divider in a manner in which the magnitudes of the currents of the current source array are maintained in correct proportion with magnitudes of the currents of the current divider.

BACKGROUND OF THE INVENTION

DACs are typically constructed of an array of current source transistors that produce output currents of weighted values that represent bits in a binary word. High resolution DACs typically employ weighted current sources in which the ratio of the most significant current bit $I_{MSB}$, to the least significant current bit, $I_{LSB}$, ranges from 128:1, in the case of an eight-bit DAC, to as high as 32,768:1, in the case of a sixteen-bit DAC. In general terms, $I_{MSB}/I_{LSB}=2^{(N-1)}$, where N is the number of bits.

FIG. 1 shows a binary-weighted current source array circuit 10, which is based on simple gate-width scaling of depletion mode field effect transistors ("FETs"). Circuit 10 includes constant-current source FETs $Q_0$, $Q_1$, $Q_2$, ..., $Q_{N-2}$, $Q_{N-1}$, where N is the number of bits. Transistors $Q_0$, $Q_1$ ..., $Q_{N-1}$ conduct currents $I_{MSB}$, $I_{MSB-1}$, $I_{MSB-2}$ ..., $I_{LSB+1}$, $I_{LSB}$, respectively, whose magnitudes correspond to the binary-weighted bits. The gates of transistors $Q_0$, $Q_1$, ..., $Q_{N-1}$ are each biased by the same reference voltage, $V_{ref}$, which controls the absolute magnitudes of currents $I_{MSB}$, $I_{MSB-1}$, ..., $I_{LSB}$. Although transistors $Q_0$, $Q_1$, ..., $Q_{N-1}$ are FETs, the principles discussed herein also apply to DACs using bipolar junction transistors ("BJTs").

The gate widths of $Q_0$, $Q_1$, ..., $Q_{N-1}$ are equal to $W_{MSB}/2^i$, where i=bit number and the bit number represents the order or "degree of significance" of the bit. Therefore, for an eight-bit DAC, the gate width of $Q_0$, which provides the current for the most significant bit, i.e., bit 7, is $W_{MSB}/2^0=W_{MSB}$. The gate width of $Q_1$ is $W_{MSB}/2^1=W_{MSB}/2$. The gate width for the least significant bit is equal to $W_{LSB}=W_{MSB}/2^7$. In a typical embodiment, the value of the drain-to-source voltage, $V_{DS}$, and the gate width of each transistor are chosen so that the value of the gate-to-source voltage, $V_{GS}$, of each transistor is zero for the desired current.

The value of each current is equal to $I_{MSB}/2^i$, where i=bit number which is as defined above. The value of current for the most significant bit, e.g., bit 0 in an eight-bit DAC, is $I_{MSB}/2^0=I_{MSB}$. The value of current for bit 1 is $I_{MSB-1}=I_{MSB}/2^1=I_{MSB}/2$. The value of current for the least significant bit, i.e., bit 7, is $I_{LSB}=I_{MSB}/2^7$.

Source degeneration resistors having values $R_s$, $2R_s$, $4R_s$, ..., $2^{N-1}R_s$ are connected between transistors $Q_0$, $Q_1$, ..., $Q_{N-1}$, respectively, and $V_{SS}$, which is a more negative voltage than the reference input voltage, $V_{ref}$, to enhance scaling (ratioing) among the various current sources.

The number of bits that may be employed in a DAC using only width scaling as the means of establishing the bit currents is severely limited because of the constraints of minimum and maximum acceptable dimensions for semiconductor devices. A gallium arsenide ("GaAs") transistor, for example, does not produce linear scaling of output current as a function of gate width if the gate width is "too narrow," e.g., a typical value being less than 10 microns. Therefore, unless the width $w_{MSB}$ is unacceptably large, the DAC of circuit 10 cannot have very many bits if $w/2^i$ is no smaller than 10 microns. For example, if the least significant bit (i.e., bit 7) of a simple width-scaled eight-bit DAC has a gate width $w_{LSB}$ of 10 microns, then the gate width of bit 6 is 2 $w_{LSB}=20$ microns, the gate width of bit 5 is 4 $w_{LSB}=40$ microns, the gate width of bit 4 is 8 $w_{LSB}=80$ microns, the gate width of bit 3 is 16 $w_{LSB}=160$ microns, the gate width of bit 2 is 32 $w_{LSB}=320$ microns, the gate width of bit 1 is 64 $w_{LSB}=640$ microns, and the gate width of the most significant bit, bit 0, $w_{MSB}=1,280$ microns. Depending on the application, gate widths in excess of 100 to 300 microns are considered to be an unacceptably inefficient use of the chip material, and/or the associated currents are unacceptably large. In this case, only one-half of the bits of the eight-bit DAC would have acceptable gate widths of less than 100 microns, i.e., a 4 or 5 bit DAC would present the largest "acceptable" device.

On the other hand, if the most significant bit (i.e., bit 0) of a simple width scaled eight-bit DAC has a gate width $w_{MSB}$ of 100 microns, then the gate width of bit 1 is $w_{MSB}/2=50$ microns, the gate width of bit 2 is $w_{MSB}/4=25$ microns, the gate width of bit 3 is $w_{MSB}/8=12.5$ microns, the gate width of bit 4 is $w_{MSB}/16=6.25$ microns, and the gate widths of bits 5, 6, and 7 are all less than 10 microns. Therefore, only bits 4–7 of the eight-bit DAC would have acceptable gate widths of 10 microns or greater.

Referring to FIG. 2, an approach to overcoming the constraints associated with simple width scaling involves the use of a weighted cascode current divider 20 which, in this example, conducts currents $I_a$(largest), $I_b$, $I_c$, $I_d$, and $I_e$(smallest). Currents $I_a$-$I_e$ are summed at node 26 to become current $I_s$, which is conducted by a master current source transistor 28. Currents $I_a$-$I_e$ are conducted through transistors 30a, 30b, 30c, 30d, and 30e, respectively, and source degeneration resistors $R_s/16$, $R_s/8$, $R_s/4$, $R_s/2$, and $R_s$, respectively.

The gate widths of transistors 30a–30e are 16 w, 8 w, 4 w, 2 w, and w, respectively. The gate width of transistor 28 is w. The sum of currents $I_a$-$I_e$ is equal to current $I_s$, the upper limit of which is constrained by the width of transistor 28. The value of current $I_s$ is controlled by adjusting $V_{ref}$. The relative magnitudes of currents $I_a$-$I_e$ are set by the width or area ratios of the cascode transistors 30a–30e. Because the widths of the cascode transistors 30a–30e do not establish the absolute currents, reasonably sized transistors, e.g., w=10 to 15 microns and 16 w=160 to 240 microns, may be used for transistors 30a–30e, resulting in output currents corresponding to effective scaled widths of w/2, w/4, w/8, w/16 and w/32 which can be much smaller than the width of physically realizable devices.

The techniques of FIGS. 1 and 2 may be combined to obtain a wide range of current ratios, as shown in FIG. 3. Referring to FIG. 3, an eight-bit binary weighted current source array circuit 34 provides currents $I_0$(MSB), $I_1$, $I_2$, $I_3$, $I_4$, $I_5$, $I_6$, and $I_7$(LSB). Currents $I_0$-$I_3$ are provided by a binary-weighted simple width-scaled current source array 36, which includes field effect transistors 44a, 44b, 44c, 44d, 48a, 48b, 48c, and 48d.

Currents $I_4$-$I_7$ are provided by a weighted cascode current divider 38 which is similar to circuit 20 in FIG. 2.

Currents $I_0$-$I_3$ have the following relationship: $I_1 = I_0/2$, $I_2 = I_0/4$, and $I_3 = I_0/8$. The values of currents $I_0$-$I_3$ are determined by the gate widths and values of $V_{DS}$ of transistors 44a–44d and 48a–48d and by the values of reference voltage $V_{ref}$ and bias voltage $V_{BIAS}$ connected to the gates of transistors 44a–44d and transistors 48a–48d, respectively. The gate widths of transistors 44a and 48a are 8 w, the gate widths of transistors 44b and 48b are 4 w, the gate widths of transistors 44c and 48c are 2 w, and the gate widths of transistors 44d and 48d are w. Width w may be chosen to be as small as allowed by the fabrication process, consistent with the criteria that it still provide linear scaling of drain current with gate width.

The parameters for transistors 44a–44d and 48a–48d are chosen as follows. The gate width 8 w of transistor 44a is chosen so that the desired current $I_0$ will be produced with $V_{GS}=0$ and $V_{DS}=2$ volts. For purposes of illustration, choose the voltage $V_{SS}=-12$ volts. The voltage drop across resistor 50a, which has resistance $R_s/8$, is chosen to be 3 volts. Because $V_{GS}=0$ for transistor 44, $V_{ref}$ is $-9$ volts. Because $V_{DS}=2$ volts, the drain of transistor 44a is greater than or equal to $-7$ volts. Transistor 48a has the same gate width 8 w as does transistor 44a. Therefore, for transistor 48a, if $V_{DS}=2$ volts, then $V_{GS}=0$ volts, requiring $V_{BIAS}=-7$ volts for consistency. The voltage at the drain of transistor 48a is greater than or equal to $-5$ volts.

Currents $I_1$, $I_2$, and $I_3$ are set to be equal to $I_0/2$, $I_0/4$, and $I_0/8$, by setting the following values for transistors 44b–44d, 48b–48d, and resistors 50b, 50c, and 50d, respectively. Transistors 44b and 48b have width=4 w, 44c, 48c have width=2 w, and 44d, 48d have width=w. Source degeneration resistors 50b–50d have resistances $R_s/4$, $R_s/2$, and $R_s$, respectively. The voltages at the drains, gates, and sources of transistors 48b–48d are equal to the voltages at the drain, gate, and source, respectively, of transistor 48a. The voltages at the drains, gates, and sources of transistors 44b–44d are equal to the voltages at the drain, gate, and source, respectively, of transistor 44a. Given these parameters, currents $I_0$-$I_3$ each are "above the knee" on the flat saturation part of the $I_D$ vs. $V_{DS}$ FET characteristic curve, for their respective gate widths.

Currents $I_4$-$I_7$ and $I_7'$ are conducted by transistors 56a, 56b, 56c, 56d, and 56e, respectively, of cascode current divider 38. Currents $I_4$-$I_7$ have the following relationship: $I_5=I_4/2$, $I_6=I_4/4$, and $I_7=I_7'=I_4/8$. The gates of transistors 56a–56d are each connected to voltage $V_{BIAS}$. The gate widths of transistors 56a–56e are 8 w, 4 w, 2 w, w, and w, respectively. Source degeneration resistors 62a, 62b, 62c, 62d, and 62e, having resistances $R_{sc}/8$, $R_{sc}/4$, $R_{sc}/2$, $R_{sc}$ and $R_{sc}$, respectively, are connected between the sources of transistors 56a–56e, respectively, and node 66. Currents $I_4$-$I_7$, and $I_7'$ are summed at node 66 to become current $I_3'$. Therefore, $I_4+I_5+I_6+I_7+I_7'=I_3'$. Ideally, current $I_3'$ is equal to $I_3$, although in practice it will deviate from the value of $I_3$. If current $I_3$ 40 is not equal to $I_3$, then currents $I_4$-$I_7$ will not have the correct proportional relationship with currents $I_0$-$I_3$.

The reason why $I_3'$ might not equal $I_3$ is as follows. The voltage at the drains of transistors 56a–56e is chosen to be greater than or equal to $-5$ volts, consistent with the bias at the drains of transistors 48a–48d.

The magnitudes of currents $I_4$-$I_7$, and $I_7'$ are each less than $I_{DSS}$ for their respective transistors 56a–56e, but are above the knee of the $I_d$ vs. $V_{DS}$ curve for transistors 56a–56e. Therefore, the voltages $V_{GS}$, for transistors 56a–56e are less than zero, for example, $-1$ volt. Recall that the voltage $V_{BIAS}$ is equal to $-7$ volts. Therefore, the voltages at the sources of transistors 56a–56e will be equal to $-6$ volts. In order for there to be proper scaling between current $I_3$ and currents $I_4$, $I_5$, $I_6$, and $I_7$, as described previously, it is desirable that there be close matching of the magnitudes of currents $I_3$ and $I_3'$. For this close matching, both the physical dimensions of transistors 44d and 70, as well as their respective bias conditions $V_{GS}$ of transistor 44d compared to $V_{GS}$ of transistor 70 and $V_{DS}$ of transistor 44d compared to $V_{DS}$ of transistor 70 should be as closely matched as possible. In the case of the circuit topology shown in FIG. 3, the fact that transistors 56a–56e operate significantly below $I_{DSS}$ (i.e., $V_{GS}$ of transistors $56a-56e<<0$ volts), while transistors 48a–48d operate at $I_{DSS}$ (i.e., $V_{GS}$ of transistor $44a-48d=0$ volts), will virtually guarantee that $V_{DS}$ of transistor $44d \neq V_{DS}$ of transistor 70, leading to $I_3 \neq I_3'$, and, hence, significant and unacceptable scaling error between current $I_3$ and currents $I_4$, $I_5$, $I_6$ and $I_7$.

A partial solution to the problem of $V_{DS}$ of transistor $44d \neq V_{DS}$ of transistor 70 involves the appropriate choice of the value of resistors 62a–62e such that $I_4 \cdot R_{sc}/8 = I_5 19$    $R_{sc}/4 = I_6 \cdot R_{sc}$    $/2 = I_7 \cdot R_{sc} = |V_{S56a} - V_{S48d}|$, where $V_{S56a}$ is the voltage of the source of transistor 56a and $V_{S48d}$ is the voltage of the source of transistor 48d. However, such a choice may only be correct for one particular temperature, power supply condition, and absolute value of $I_3$ and $I_3'$. Variations in these parameters may result in a scaling error between $I_3$ and $I_3'$. Furthermore, practical limitations on the size of resistors $R_{sc}$, $R_{sc}/2$, $R_{sc}/4$, $R_{sc}/8$ may force one to choose $I_4 \cdot R_{sc}/8 = I_5 \cdot R_{sc}/4 = I_6 \cdot R_{sc}/2 = I_7 \cdot R_{sc} < |V_{S56a} - V_{S48d}| \cdot$ In that case, one will be unable to reduce the offset between $V_{DS}$ of transistor 44d and $V_{DS}$ of transistor 70 to 0 volts.

Another partial solution to the problem of the voltage at the drains of transistors 44d and 70 not being equal, is to use one bias, $V_{BIAS1}$, for transistors 48a–48d, and to use another bias, $V_{BIAS2}$, for the gates of transistors 56a–56d. The difference between $V_{BIAS1} - V_{BIAS2}$ is $V_{OS}$. Voltage $V_{OS}$ is equal to the absolute value of $V_{GS}$ of transistors 56a–56e minus $I_5 R_{sc}/8$. The effectiveness of this technique depends upon the number of bits in the DAC. For example, the technique may work with a DAC having eight bits, but not more than eight bits. Further, the effectiveness of the technique is temperature, process, and power supply voltage dependent. Even in the best of conditions, the voltages at the drains of transistors 44d and 70 will be only approximately equal.

There is, therefore, a need in a high resolution DAC for a current source in which the correct current relationship is maintained between the currents of the binary-weighted current source array and the currents of the binary-weighted cascode current divider.

SUMMARY OF THE INVENTION

It is, therefore, an object of the present invention to provide a high resolution DAC in which the currents of the weighted cascode current divider are maintained in correct proportion with the currents of the binary-weighted current source array.

In the present invention, a DAC includes a simple width scaled binary-weighted array of N number of current sources and a binary-weighted cascode current divider comprised of M number of current sources. The simple width-scaled binary-weighted array conducts N first scaled currents, the array including N first transistors connected to different ones of N second transistors one of the N first transistors having a gate width w. The binary-weighted cascode current divider includes M current sources, the current divider including M third transistors that conduct M second scaled currents which are summed at a node. The node is connected to a master current transistor that conducts a current $I_S$ and has a gate width w. In one embodiment, the bias terminal of the N first transistors is tied to the node, whereby relative magnitudes of the N first scaled currents remain in correct proportion to relative magnitudes of the M second scaled currents in spite of changes in the magnitude of current $I_S$. In another embodiment, the first and second inputs to an operational amplifier are connected to the node and the drain of the transistor of the N first transistors having a gate width w, respectively. The output to the operational amplifier is connected to the bias terminal of the N first transistors. The DAC is not limited to a particular number of bits. The DAC could have eight bits with, for example, N=4 and M=4. The DAC could have twelve bits with, for example, N=6 and M=6.

DETAILED DESCRIPTION OF PREFERRED EMBODIMENT

Figure 1:
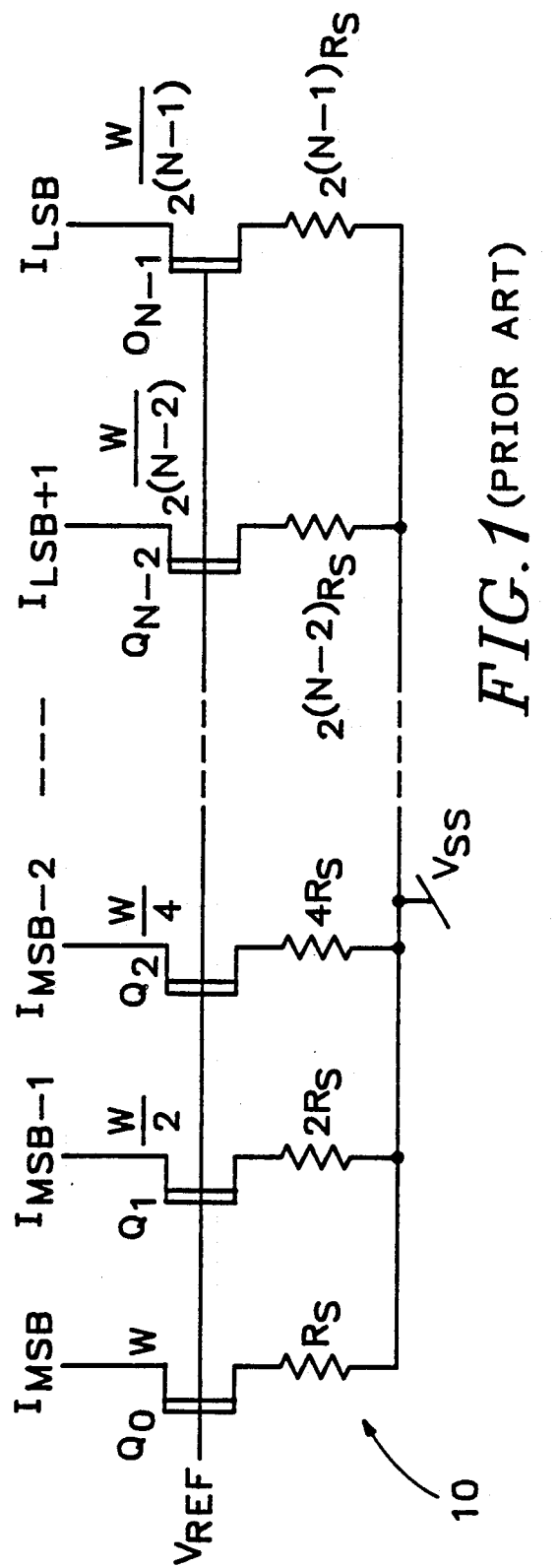
FIG. 1 is a circuit schematic diagram of a prior art binary-weighted current source array circuit.
Figure 2:
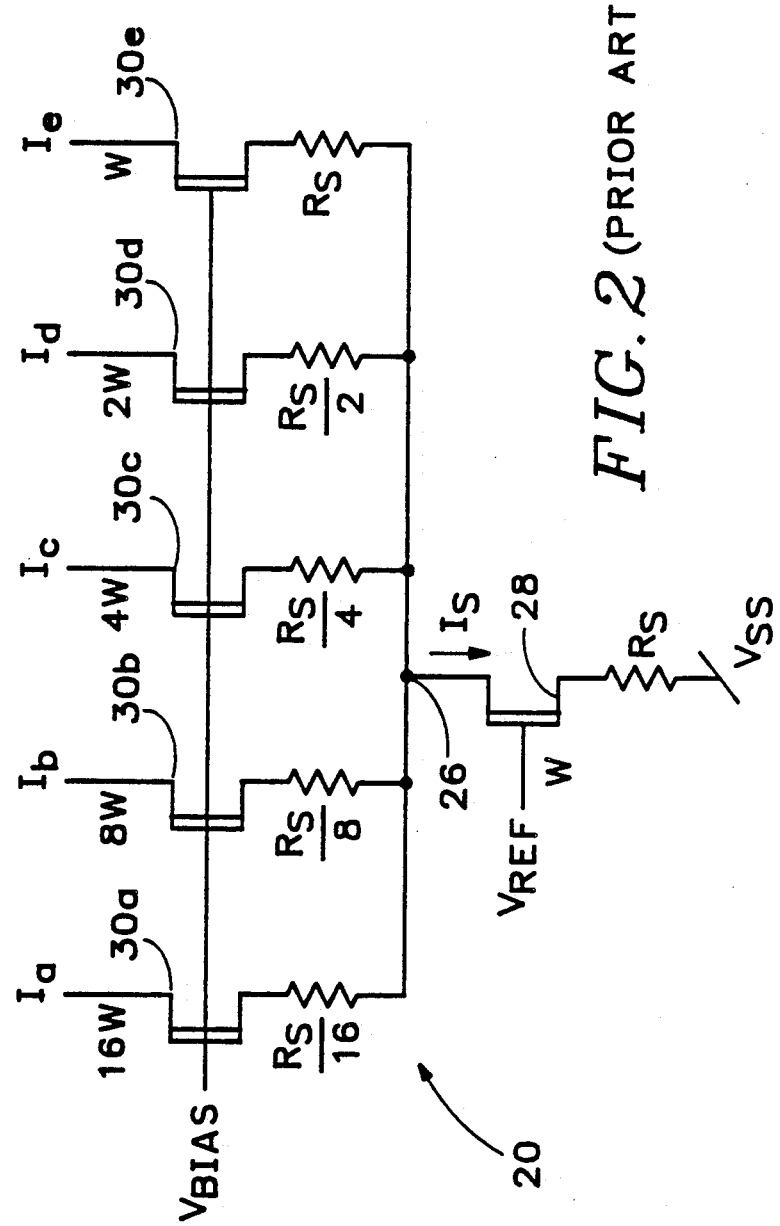
FIG. 2 is a circuit schematic diagram of a prior art weighted cascode current divider.
Figure 3:
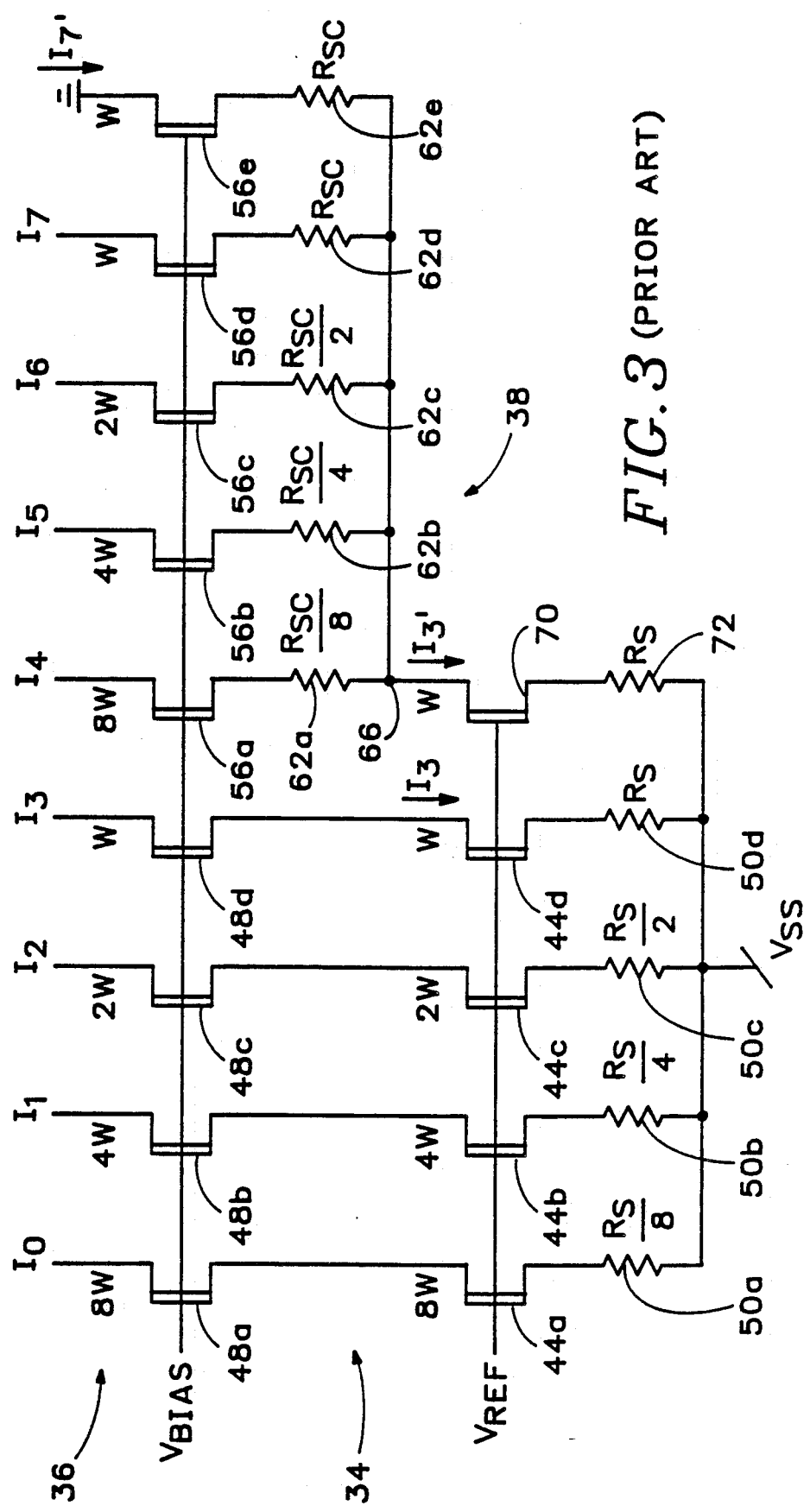
FIG. 3 is a circuit schematic diagram of a prior art circuit incorporating a combination of the circuits of FIGS. 1 and 2.
Figure 4:
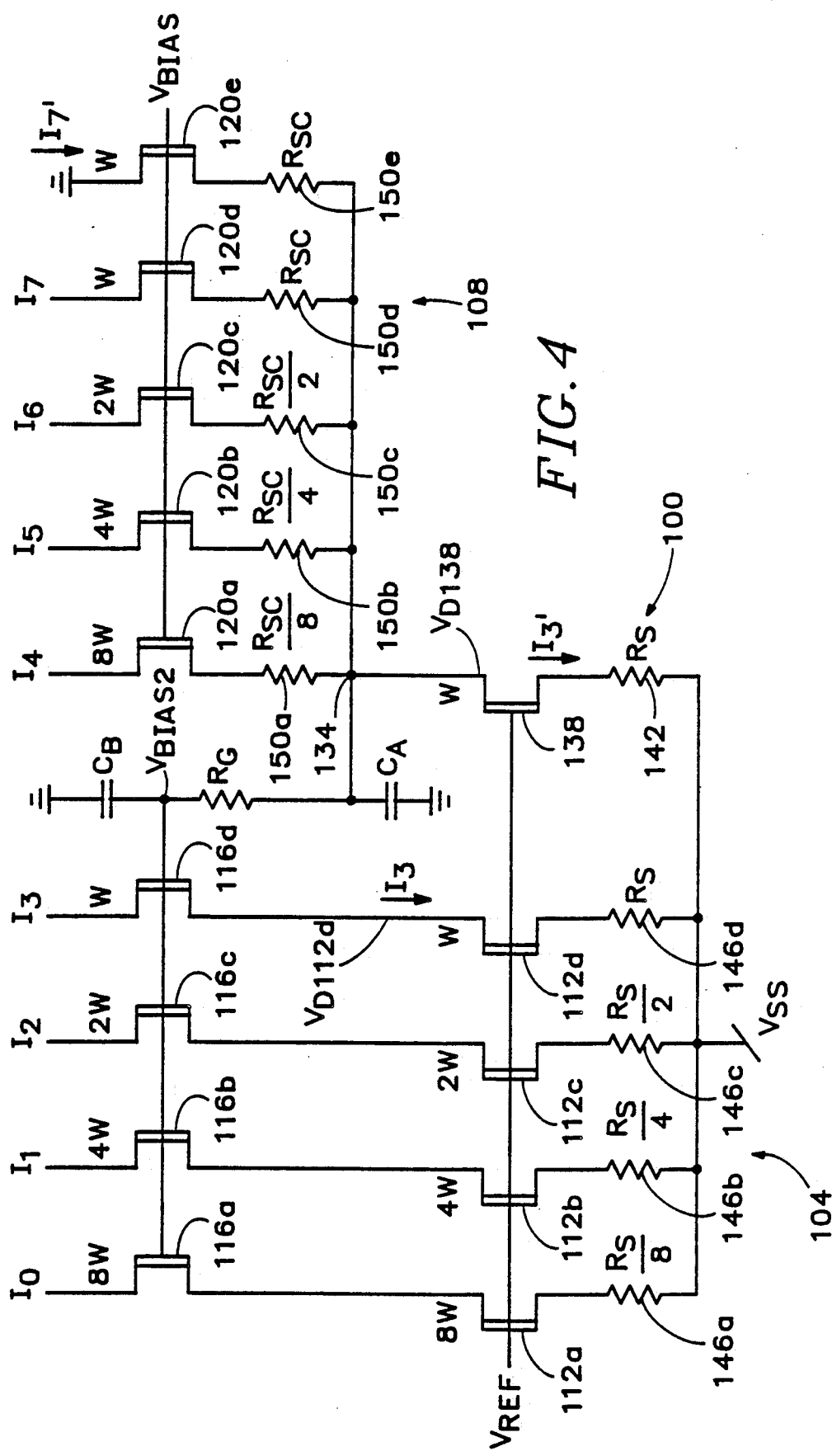
FIG. 4 is a circuit schematic diagram of a simple width-scaled binary-weighted current source array in parallel with a binary-weighted cascode current divider of the present invention.

Referring to FIG. 4, circuit 100 is an eight-bit binary-weighted current source array that provides currents $I_0$ (MSB), $I_1$, $I_2$, $I_3$, $I_4$, $I_5$, $I_6$, and $I_7$ (LSB). Currents $I_0$–$I_3$ are provided by a binary-weighted simple width-scaled current source array 104. Currents $I_4$–$I_7$ are provided by a weighted cascode current divider 108.

The present invention is not limited to DACs having a particular number of bits. Circuit 100 is arbitrarily chosen to have eight bits. If circuit 100 were part of a 12-bit DAC, for example, then current source array 104 could have six scaled currents, and cascode current divider 108 could have another six scaled currents. If circuit 100 were part of a 20-bit DAC, for example, then current source array 104 could have ten scaled currents, and cascode current divider 108 could have another ten scaled currents. The number of currents in current source array 104 need not equal the number of currents in cascode current divider 108.

Current source array 104 includes transistors 112a, 112b, 112c, and 112d that conduct currents $I_0$–$I_3$, respectively, and transistors 116a, 116b, 116c, and 116d, that also conduct currents $I_0$–$I_3$, respectively. Cascode current divider 108 includes transistors 120a, 120b, 120c, and 120d that conduct currents $I_4$–$I_7$, and $I_7'$, respectively. Currents $I_4$–$I_7$, and $I_7'$ sum at node 134 at the drain of transistor 138 to become current $I_3'$. Current $I_3'$ flows from the drain to the source of transistor 138 and through resistor 142, which has a resistance value of $R_s$.

Although transistors 112a–112d, 116a–116d, and 120a–120d are shown to be depletion mode field effect transistors (FETs), they may be bipolar junction transistors (BJTs). Further, transistors 112a–112d, 116a–116d, and 120a–120b are not restricted to a particular type of FET or BJT.

Source degeneration resistors 146a, 146b, 146c, and 146d, having resistances $R_{sc}/8$, $R_{sc}/4$, $R_{sc}/2$, and $R_{sc}$, are connected between voltage $V_{ss}$ and the sources of transistors 112a, 112b, 112c, and 112d, respectively. Source degeneration resistors 150a, 150b, 150c, and 150d, having resistances $R_{sc}/8$, $R_{sc}/4$, $R_{sc}/2$, $R_{sc}$, and $R_{sc}$ are connected between node 134 and transistors 120a, 120b, 120c, 120d, and 120e, respectively.

Biasing transistors 116a–116d to the voltage at node 134 and choosing correct parameters for circuit 100 provides currents $I_4$–$I_7$ in correct proportion to currents $I_0$–$I_3$, i.e., $I_4 = I_3/2$, $I_5 = I_3/4$, $I_6 = I_3/8$, $I_7 = I_7' = I_3/16$. The voltage at node 134 is equal to the voltage at the drain of transistor 138 and is designated $V_{D138}$. The parameters for transistors 112a–112d and 116a–116d are chosen as follows. The gate width 8 w of transistor 112a is chosen so that the desired current $I_0$ will be produced with $V_{GS}=0$ and $V_{DS}=2$ volts (for example). The voltage $V_{SS}$ is chosen to be $-12$ volts. The voltage drop across resistor 146a, which has resistance $R_s/8$, is 3 volts. Because $V_{GS}=0$ for transistor 112a, $V_{ref}$ is $-9$ volts. Because $V_{DS}=2$ volts, the voltage at the drain of transistor 112a is greater than or equal to $-7$ volts. Transistor 116a has the same gate width 8 w as does transistor 112a. Therefore, for transistor 116a, if $V_{DS}=2$ volts, then $V_{GS}=0$ volts and $V_{BIAS2}=-7$ volts. The voltage at the drain of transistor 116a is greater than or equal to $-5$ volts for proper operation. It is noted that the specific voltage values given herein are only by way of example. The invention will work with other appropriate and self-consistent voltage values.

Currents $I_1$, $I_2$, and $I_3$ are set to be equal to $I_0/2$, $I_0/4$, and $I_0/8$ by setting the following parameter values. Transistors 112b–112d have gate widths 4 w, 2 w, and w, respectively; and transistors 116b–116d have gate widths 4 w, 2 w, and w, respectively. Source degeneration resistors 146b–146d have resistances $R_s/4$, $R_s/2$, and $R_s$, respectively. The gates of transistors 112b–112d are each tied to voltage $V_{REF}$ and the gate of transistor 112a. The voltages at the drains, gates, and sources of transistors 112b–112d are equal to the voltages at the drain, gate, and source, respectively, of transistor 112a. The voltages at the drains, gates, and sources of transistors 116b–116d are equal to the voltages at the drain, gate, and source, respectively, of transistor 116a. Given each of these parameters, currents $I_0$–$I_3$ each are on the flat part of the $I_D$ vs. $V_{DS}$ FET characteristic curve, for their respective gate widths.

The gates of transistors 120a–120d are each tied to voltage $V_{BIAS}$. The gate widths of transistors 120a–120d are 8 w, 4 w, 2 w, and w, respectively. The voltage at the drains of transistors 120a–120e is greater than or equal to −5 volts. The magnitudes of I₄–I₇, and I₇' are each less than $I_{DSS}$, but are above the knee of the $I_D$ vs. $V_{DS}$ curve for transistors 120a–120e. Therefore, the voltages $V_{GS}$ for transistors 120a–120e are less than zero, for example, −1 volt. The voltage $V_{BIAS}$ is greater than or equal to −7 volts.

As noted above, the gate-to-source voltage $V_{GS}$ of transistor 116d is zero volts. Therefore, with the gates of transistors 116a–116d being tied to node 134, the voltages at the drains of transistors 112a–112d will track $V_{D138}$. Voltage $V_{D138}$ is ideally equal to the voltage $V_{D112d}$ at the drain of transistor 112d, and current I₃' is ideally equal to current I₃. As voltage $V_{D138}$ varies due to temperature and/or power supply changes, the voltages at the drains of transistors 112a–112d vary by a like amount, maintaining equality between I₃ and I₃' and, hence, proportionality between I₀–I₃ and I₄–I₇. The absolute values of currents I₀–I₇ are adjusted by means such as voltage $V_{REF}$.

Figure 5:
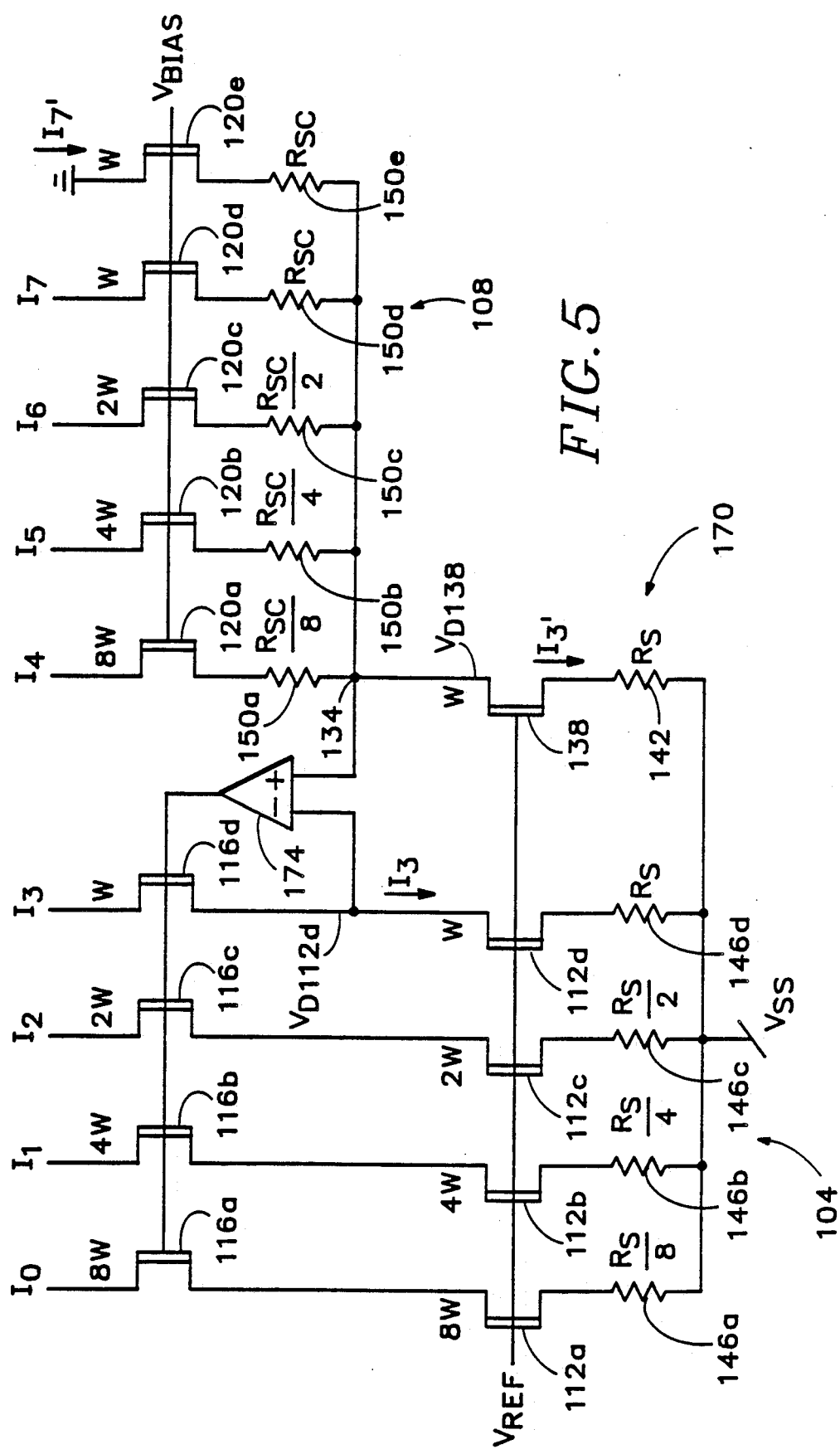
FIG. 5 is a circuit schematic diagram of a simple width-scaled binary-weighted current source array in parallel with a binary-weighted cascode current divider of the present invention in which an operational amplifier is employed.

Referring to FIG. 5, an alternative embodiment to the circuit of FIG. 4 is shown in circuit 170. Circuit 170 employs the same reference numbers as does FIG. 4, except for the addition of operational amplifier 174. Circuit 170 may produce more accurate binary-weighted currents I₀–I₇ but is also more complex than circuit 100 of FIG. 4.

The inverting and noninverting inputs to the operational amplifier are connected to the drain of transistor 112d and to node 134, respectively. The output of operational amplifier 174 is biased so that it is equal to a nonzero value whenever voltage $V_{D112d}$ equals $V_{D138}$. Voltage $V_{D138}$ is ideally equal to $V_{D112d}$, and current I₃' is ideally equal to current I₃. If the voltage at node 134 becomes greater than voltage $V_{D112d}$, the voltage of the output of operational amplifier 174 increases causing $V_{D112d}$ to increase until $V_{D112d}$ again equals the voltage at node 134, which maintains I₃=I₃' and proper scaling among currents I₀–I₃ and I₄–I₇.

Conversely, if the voltage at node 134 becomes smaller than $V_{D112d}$, the voltage of the output of operational amplifier 174 decreases causing $V_{D112d}$ to decrease until $V_{D112d}$ equals the voltage at node 134, forcing I₃=I₃'. Therefore, the relative values of I₀–I₃ remain in correct proportion with the relative values of I₄–I₇. The absolute values of currents I₀–I₇ are adjusted by means such as voltage $V_{REF}$.

The purpose of transistor 120e will now be explained. In order to obtain proper scaling between current I₃ and currents I₄, I₅, I₆, and I₇, one ends up with $I_4+I_5+I_6+I_7=I_3(15/16)$. If the I₇' transistor and associated $R_{sc}$ source resistor are not used, transistor 138 in FIG. 4 would be made equal to 15/16 the width of transistor 112d (i.e., W of transistor 70=15/16 W of transistor 44d). Likewise, the resistance of resistor 146d would be equal to the resistance of resistor 142. Such relationships are difficult to make. It is much easier to maintain a 1:1 relationship between transistors 112d and 138, and resistors 146d and 142.

Resistor $R_G$ and capacitors $C_A$ and $C_B$ in FIG. 4 provide high-frequency isolation between the cascode networks, which helps improve DAC settling time.

Although binary-weighted currents have been used as examples in FIGS. 4 and 5, other scaled current relationships, e.q., logarithmic and sine/cosine weighting, could be used with the invention.

It will be obvious to those having skill in the art that many changes may be made in the above described details of the preferred embodiments of the present invention without departing from the underlying principles thereof. The scope of the present invention should be determined, therefore, only by the following claims.

We claim:

1. A digital-to-analog converter current source having M+N number of bits, comprising:
   a dimension-scaled weighted array of N current sources that conduct N first scaled currents, the array including N first transistors connected to different ones of N second transistors, one of the N first transistors having a dimension w; and
   a dimension-scaled weighted cascode current divider comprised of M current sources, the current divider including M third transistors that conduct M second scaled currents which are summed at a node, the node being connected to a master current transistor that conducts a current $I_s$ having a magnitude, the master current transistor having a dimension w, the bias of the N first transistors being tied to the node, whereby relative magnitudes of the N first scaled currents remain in correct proportion to relative magnitudes of the M second scaled currents in spite of changes in the magnitude of current $I_s$.

2. The converter of claim 1 in which the N first transistors, the N second transistors, the M third transistors, and the master current transistor are depletion mode field effect transistors, and in which the dimension is a gate width.

3. The converter of claim 1 in which the N first transistors, the N second transistors, the M third transistors, and the master current transistor are bipolar junction transistors and in which the dimension is the base size.

4. The converter of claim 1 in which M=4 and N=4.

5. The converter of claim 1 in which M=6 and N=6.

6. The converter of claim 1 in which M=7 and N=5.

7. The converter of claim 1 in which the dimension-scaled weighted array of N current sources is a binary-weighted array and the M current sources of the dimension-scaled weighted cascode current divider are binary-weighted.

8. A digital-to-analog converter current source having M+N number of bits, comprising:
   a dimension scaled weighted array of N current sources that conduct N currents, the array including N first transistors each being connected to one of N second transistors, one of the N first transistors having a dimension w;
   a dimension scaled weighted cascode current divider comprised of M current sources, the current divider including M third transistors that conduct M currents which are summed at a node, the node being connected to a master current transistor that conducts a current $I_s$, the master current transistor having a dimension w; and
   operational amplifier means having first and second inputs for receiving respective first and second input voltages and an output for producing a first output voltage whenever the first and second input voltages are equal, and for producing a second output that is indicative of a difference between the first and second input voltages whenever the first and second input voltages are not equal, and the first input being connected to the transistor having the dimension w, the second input being connected to the node, the output being connected to the N first transistors, whereby relative magnitudes of the N first scaled currents remain in correct proportion to relative magnitudes of the M second scaled currents in spite of changes in the magnitude of current $I_s$.

9. The converter of claim 8 in which the N first transistors, the N second transistors, the M third transistors, and the master current transistor are depletion mode field effect transistors, and in which the dimension is a gate width.

10. The converter of claim 8 in which the N first transistors, the N second transistors, the M third transistors, and the master current transistor are bipolar junction transistors, and in which the dimension is the base size.

11. The converter of claim 8 in which M=4 and N=4.

12. The converter of claim 8 in which M=6 and N=6.

* * * * *